(12) United States Patent
Friedemann et al.

(10) Patent No.: US 6,984,294 B2
(45) Date of Patent: Jan. 10, 2006

(54) METHOD OF FORMING A CONDUCTIVE BARRIER LAYER HAVING IMPROVED COVERAGE WITHIN CRITICAL OPENINGS

(75) Inventors: Michael Friedemann, Dresden (DE); Volker Kahlert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 190 days.

(21) Appl. No.: 10/624,420

(22) Filed: Jul. 22, 2003

(65) Prior Publication Data

US 2004/0168908 A1  Sep. 2, 2004

(30) Foreign Application Priority Data

Feb. 28, 2003 (DE) ............................... 103 08 968

(51) Int. Cl.
 C23C 14/34 (2006.01)
 H01L 21/44 (2006.01)
(52) U.S. Cl. ...................... 204/192.22; 204/192.15; 204/192.12; 438/685; 438/785
(58) Field of Classification Search .......... 204/192.12, 204/192.15, 192.22; 438/685, 785
 See application file for complete search history.

(56) References Cited

U.S. PATENT DOCUMENTS

| | | | |
|---|---|---|---|
| 5,108,570 A * | 4/1992 | Wang | 204/192.3 |
| 5,963,827 A | 10/1999 | Enomoto et al. | 438/629 |
| 6,306,732 B1 | 10/2001 | Brown | 438/468 |
| 6,365,510 B2 | 4/2002 | Schmidbauer et al. | 438/675 |
| 6,380,058 B2 * | 4/2002 | Manabe et al. | 438/597 |
| 2003/0209422 A1 * | 11/2003 | Wang et al. | 204/192.12 |
| 2004/0134769 A1 * | 7/2004 | Wang et al. | 204/192.17 |

FOREIGN PATENT DOCUMENTS

WO  WO 03/001590 A2  1/2003

OTHER PUBLICATIONS

Rossnagel et al., "Thin, high atomic weight refractory film deposition for diffusion barrier, adhesion layer, and seed layer applications," *J. Vac. Sci. Technol.*, 143:1819027, 1996.

Zhong and Hopwood, "Ionized Titanium deposition into high aspect ratio vias and trenches," *J. Vac. Sci. Technol.*, 17:405-09, 1999.

* cited by examiner

*Primary Examiner*—Steven VerSteeg
(74) *Attorney, Agent, or Firm*—Williams, Morgan & Amerson, P.C.

(57) ABSTRACT

A conductive barrier layer may be formed within high aspect ratio openings by a two-step ionizing sputter deposition. The first step is performed at low pressure and low bias power to obtain good coverage of upper portions of the openings. In the second step, the bias power and the pressure are raised to improved directionality of the particles while at the same time increasing the scatter events so that an increased deposition rate at critical structure areas is obtained, thereby achieving a good coverage at lower sidewall areas.

17 Claims, 2 Drawing Sheets

METHOD OF FORMING A CONDUCTIVE BARRIER LAYER HAVING IMPROVED COVERAGE WITHIN CRITICAL OPENINGS

BACKGROUND OF THE INVENTION

1. Field of the Invention

The present invention generally relates to the fabrication of integrated circuits, and, more particularly, to the formation of an interconnection requiring the provision of a barrier layer between a bulk metal and a dielectric in which the interconnection is embedded.

2. Description of the Related Art

In an integrated circuit, a huge number of circuit elements, such as transistors, capacitors, resistors, and the like, are formed in or on an appropriate substrate, usually in a substantially planar configuration. Due to the large number of circuit elements and the required complex layout of many modern integrated circuits, generally the electrical connection of the individual circuit elements may not be established within the same level on which the circuit elements are manufactured, but such electrical connections may be established in one or more additional "wiring" layers, also referred to as metallization layers. These metallization layers generally include metal lines, providing for the inner-level electrical connection, and also include a plurality of inter-level connections, also referred to as vias, wherein the metal lines and vias may also be commonly referred to as interconnection.

Due to the continuous shrinkage of the feature sizes of circuit elements in modern integrated circuits, the number of circuit elements for a given chip area, that is, the package density, also increases, thereby usually requiring an even larger increase in the number of electrical interconnections to provide the desired circuit functionality. Therefore, the number of stacked metallization layers may increase as the number of circuit elements per chip area becomes larger. Since the fabrication of a plurality of metallization layers entails extremely challenging issues to be solved, such as mechanical, thermal and electrical reliability of up to twelve stacked metallization layers that are required, for example, for sophisticated aluminum-based microprocessors, semiconductor manufacturers are increasingly replacing the well-known metallization metal aluminum by a metal that allows higher current densities and hence allows reduction of the dimensions of the interconnections. For example, copper is a metal generally considered to be a viable candidate for replacing aluminum due to its superior characteristics in view of higher resistance against electromigration and significantly lower electrical resistivity when compared with aluminum.

In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. In manufacturing metallization layers including copper, the so-called damascene technique is therefore preferably used wherein a dielectric layer is first blanket deposited and then patterned to define trenches and vias, which are subsequently filled with copper. A further major drawback of copper is its property to readily diffuse in silicon dioxide and other low-k dielectrics.

It is therefore necessary to employ a so-called barrier material in combination with a copper-based metallization to substantially reduce diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material as well as to the copper and should also have as low an electrical resistance as possible so as to not unduly compromise the electrical properties of the interconnection. In typical copper-based applications, tantalum and tantalum nitride, alone or in combination, as well as titanium and titanium nitride, alone or in combination, may successfully be employed as barrier layers. However, any other barrier layer schemes may be used as long as the required electrical, diffusion hindering and adhesion characteristics are obtained.

Irrespective of the material used for the barrier layer, with steadily decreasing feature sizes, process engineers are increasingly confronted with the challenging task to deposit an extremely thin barrier layer within trenches and vias having significantly high aspect ratios of approximately 5 or more for a trench width or a via diameter of about 0.2 $\mu$m and even less. The thickness of the barrier layer has to be chosen as thin as possible to not unduly consume "precious" space of the interconnection that should be filled with the more conductive copper, yet reliably suppressing or preventing the diffusion of the copper into the neighboring dielectric. The deposition of the barrier material within high-aspect-ratio vias, especially on sidewalls of lower portions of the vias, requires improved techniques for physical vapor deposition (PVD) processes, frequently used in depositing conductive materials on a substrate, since usually an enhanced directionality of the target atom sputtered off an appropriate target is necessary to direct the target atoms to the bottom of the vias.

For example, in "Thin, High Atomic Weight Refractory Film Deposition for Diffusion Barrier, Adhesion Layer and Seed Layer Applications", Rossnagel et al., *J Vac. Sci. Technol*, B14(3), May/June 1996, a method is disclosed to deposit tantalum atoms on steep via and trench sidewalls by employing conventional non-collimated sputter deposition at very low pressures to achieve the improved directionality of the tantalum atoms.

In U.S. Pat. No. 6,306,732, a method is suggested for improving the directionality of the target atoms, wherein an ionized PVD (IPVD) process is employed in combination with a subsequent re-sputtering step. In the ionized sputter process, a specified fraction of the target atoms (and of carrier and precursor gases if provided) is ionized by any appropriate means and a bias voltage is established between the ionized atoms and the substrate to guide the atoms to the substrate, wherein a distance between the target and substrate may be increased compared to conventional sputter tools. Due to the improved directionality of the target atoms, the bottom coverage of even very narrow and deep vias is excellent, whereas the sidewall coverage, especially in the vicinity of the bottom corners, is poor. The subsequent re-sputter step allows removal of a fraction or substantially all of the material formed on the bottom and to redistribute the material, preferably at the lower sidewall portions.

Although these methods show a significant improvement over standard sputter processes, the former method suffers from a reduced barrier layer thickness at the sidewalls of the via, requiring an unduly long deposition time, thereby creating an unproportional thickness at the bottom thereof, while the latter method exhibits a remarkable sensitivity to even small variations in the structure of the via or trench. For instance, varying dimensions, different sidewall angles or, in worst-case, structure irregularities, minor protrusions in the trench may lead to reduced and thus insufficient coverage at certain portions within the trench or via.

In view of the above difficulties encountered by the known methods, it is desirable to provide a technique that enables the prevention of or at least the reduction of one or more of the above-identified problems.

SUMMARY OF THE INVENTION

Generally, the present invention is directed to an improved deposition technique for forming a thin conductive layer in high-aspect openings by sputter deposition, wherein a first deposition step provides for sufficient coverage at upper portions of a via, whereas in a second deposition step the deposition preferably at the lower portions is enhanced in that the general directionality of the target atoms and ions is increased while also increasing the scattering of the target atoms and ions, by, for example, increasing a pressure in the deposition atmosphere.

According to one illustrative embodiment of the present invention, a method comprises depositing a first layer of conductive material onto a substrate having formed therein an opening in a sputter deposition atmosphere having a first state with a pressure of a first value and a bias power of a first value for accelerating target ions towards the substrate. Moreover, a second state is established for the sputter deposition atmosphere by increasing the bias power and/or the pressure to a second value. A second layer of conductive material is deposited in the sputter deposition atmosphere when the sputter deposition atmosphere is in the second state.

According to still another illustrative embodiment, a method of controlling a deposition rate in an ionized sputter deposition process comprises the following sequence: (a) providing a substrate having formed therein at least one via opening with an upper portion and a lower portion; (b) establishing a deposition atmosphere around the substrate with a specified pressure and a specified bias power for directing target ions towards the substrate; (c) determining a thickness of a deposited layer at the upper portion and the lower portion of the via opening; and (d) increasing the bias power and/or the pressure when an absolute amount of a difference of the thickness at the lower portion and the upper portion is less than a predefined threshold.

According to a further embodiment of the present invention, a method comprises forming, by sputter deposition, a conductive material layer over an interconnect opening formed on a substrate, wherein a bias power for enhancing a directionality of deposition particles and a pressure are selected to provide a greater thickness of the conductive material layer at an upper portion of the interconnect opening compared to a lower portion thereof. Then, the bias power and the pressure are increased and the formation of the conductive material layer is continued to predominantly deposit the conductive material layer at the lower portion.

BRIEF DESCRIPTION OF THE DRAWINGS

The invention may be understood by reference to the following description taken in conjunction with the accompanying drawings, in which like reference numerals identify like elements, and in which.

Figure 1A:
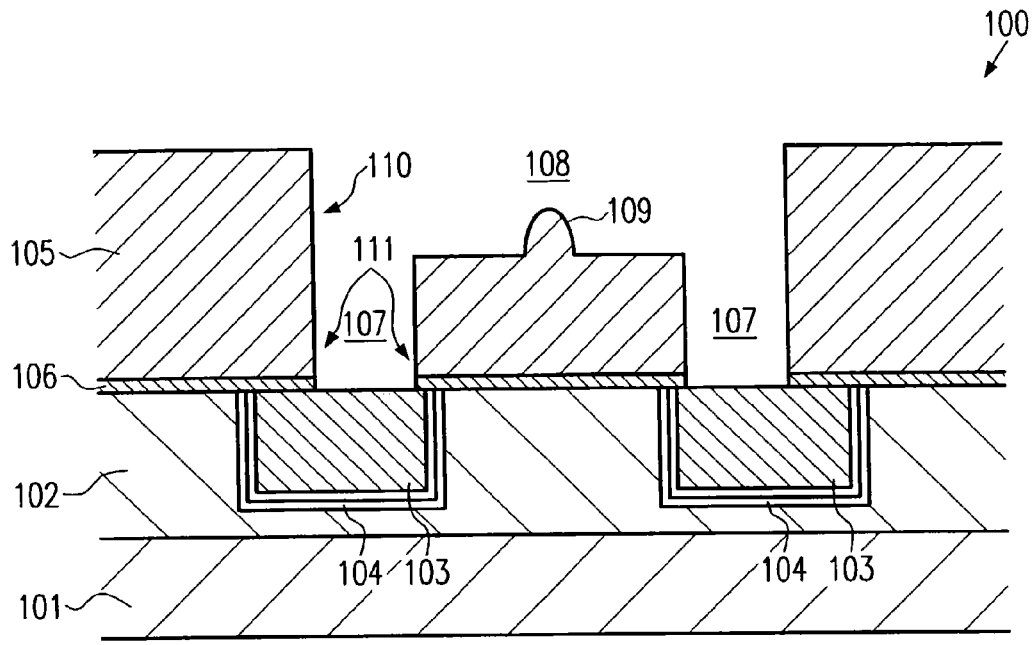
FIGS. 1a–1c schematically show cross-sectional views of a metallization structure during various manufacturing stages according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
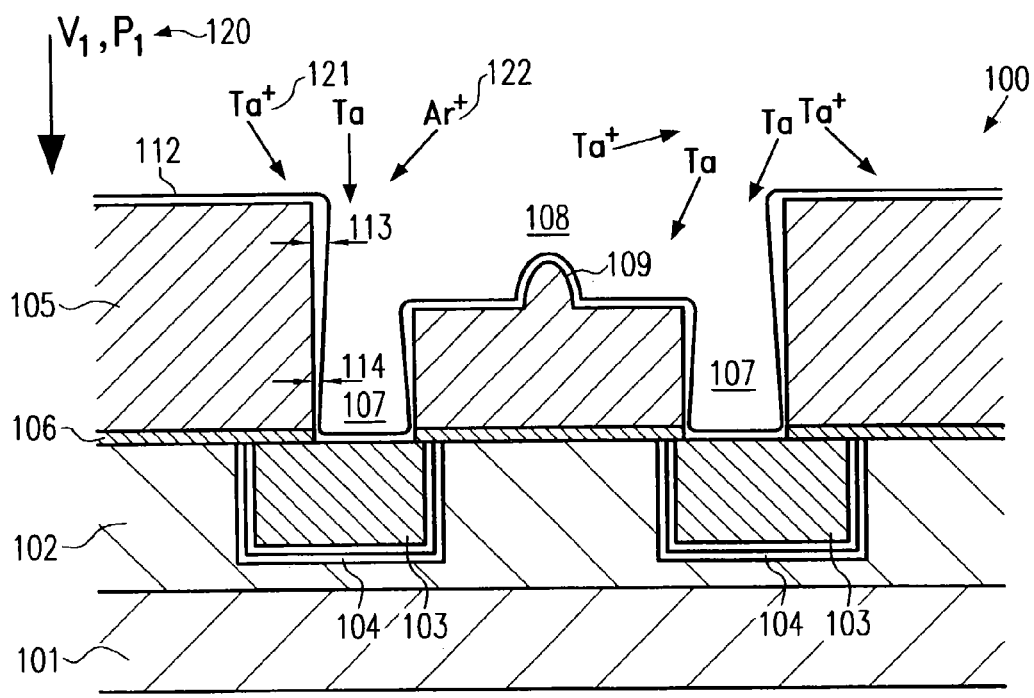
Figure 1C:
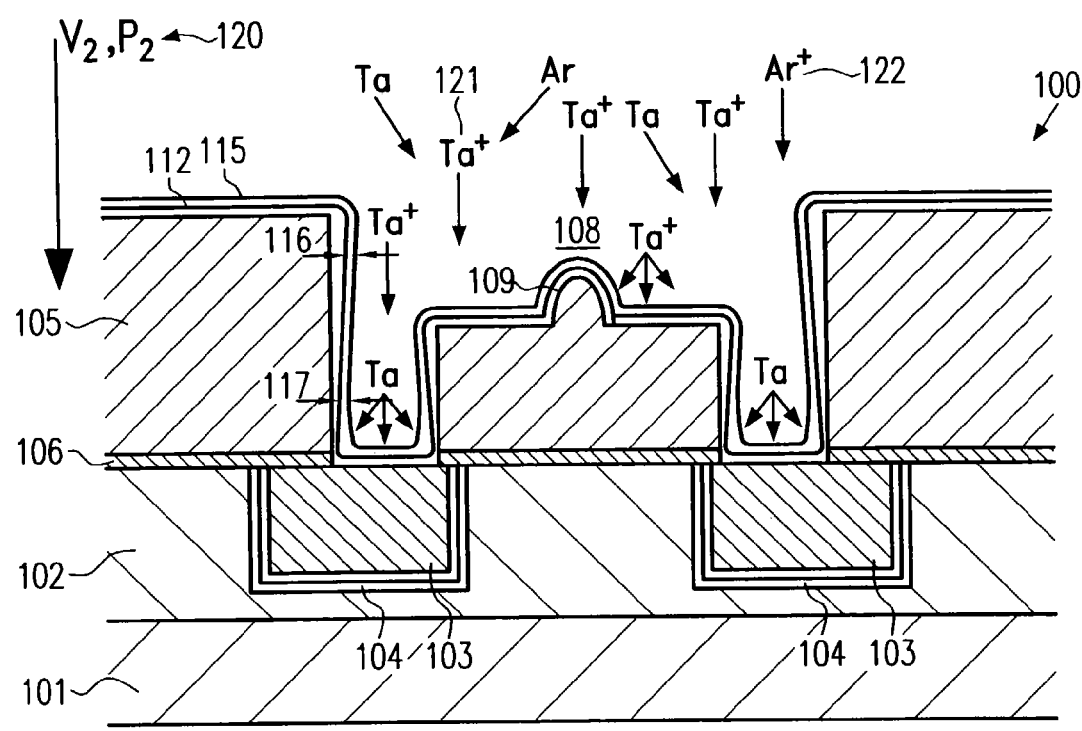

With reference to FIGS. 1a–1c, further illustrative embodiments of the present invention will now be described. In FIG. 1a, a semiconductor structure 100, here presented in the form of a dual damascene metallization structure, comprises a substrate 101 that may include various material layers (not shown) as well as circuit elements (not shown), to at least some of which an electrical connection may be created by interconnects to be formed in the semiconductor structure 100. For a highly sophisticated semiconductor structure 100, the substrate 101 may have formed thereon an insulating layer 102, comprised of a low-k dielectric material, that is, a material having a low permittivity, such as silicon carbide hydroxide (SiCOH), and the like. Metal regions 103 are formed in the insulating layer 102, wherein, depending on the type of material of the insulating layer 102 and on the type of metal in the metal regions 103, one or more barrier layers, commonly referred to as 104, may be provided. For example, the barrier layer 104 may comprise tantalum and/or tantalum nitride when the metal regions 103 comprise copper, since presently tantalum and tantalum nitride are considered the most promising candidates for an effective barrier and adhesion layer in copper-based metallization layers. A second insulating layer 105 is formed above the insulating layer 102 and partially above the metal regions 103, wherein typically a thin dielectric etch stop and barrier layer 106 is provided between the insulating layers 102 and 105. For example, the second insulating layer 105 may be comprised of SiCOH and the etch stop layer 106 may be comprised of nitrogen-containing silicon carbide. However, other material compositions may be used. For example, in devices with less critical requirements with regard to signal propagation delay owing to a high coupling capacitance of neighboring metal regions, the second insulating layer 105 and the etch stop layer 106 may be comprised of silicon dioxide and silicon nitride, respectively. Via openings 107 and a trench opening 108 are formed in the second insulating layer 105 and the etch stop layer 106. A width of the trench 108 may range from approximately 0.2–2 $\mu$m in sophisticated devices, and a diameter of the via openings may range from approximately 0.1–0.3 $\mu$m, wherein a depth of the via openings 107 may range from approximately 0.5–1.5 $\mu$m or even more. Thus, the aspect ratio of the via openings 107 may be approximately 5 or more.

It should be noted that the principles of the present invention may be applied to semi-conductor structures having trenches and openings in the above specified ranges. However, any other device dimensions may also be suitable in practicing the present invention. In particular, the trench and via openings 108, 107 are of illustrative nature only, and typically the semiconductor structure 100 may also include closely spaced trenches and vias and/or isolated trenches and vias as well as vias without a surrounding trench.

The via and trench openings 107, 108 comprise an upper portion 110 and a lower portion 111, wherein the upper portion 110 includes the sidewall of the trench opening 108 and the lower portion 111 includes the bottom of the via openings 107 and the sidewalls adjacent to the bottom of the via openings 107. Especially the lower portion 111 may be difficult to be reliably covered by a barrier layer as will be discussed in more detail below. The trench opening 108 may have formed at its bottom a protrusion 109 owing to process specific variations as will be discussed later on. The protrusion 109 may represent any typical variation in structure of modern integrated semiconductor devices and such structural variations may put at risk the device reliability if not appropriately accounted for in subsequent processes, such as the formation of a barrier layer reliably covering the entire surface of the dielectric layer 105. As previously noted, especially structural variations, such as the protrusion 109 that may form in various configurations depending on process variations and structural specifics, may not sufficiently be covered by the deposition and re-sputter method previously described.

A typical process flow for forming the semiconductor structure 100 as depicted in FIG. 1a may include the following processes. After the formation of the insulating layer 102 by well-established deposition techniques, such as plasma enhanced chemical vapor deposition (PECVD), the metal regions 103 may be formed by etch, deposition and plating processes that are similar to those described in the following with reference to the second insulating layer 105 and the via and trench openings 107, 108. Consequently, a description of these steps is omitted here. Thereafter, the etch stop/barrier layer 106 and the second insulating layer 105 are formed by an appropriate formation technique, such as PECVD for silicon carbide and SiCOH, or silicon nitride and silicon dioxide, respectively. In other embodiments, a low-k material may be used for the insulating layer 105 and may be applied by spin-coating. Next, a photolithography step is performed including the application of an anti reflective coating (ARC) and a resist layer (both layers not shown) followed by exposure and development of the resist layer. Subsequently, openings are etched into an upper portion of the insulating layer 105 according to the damascene regime used. For instance, the via openings 107 may be defined first and in a subsequent photolithography step the trench opening 108 is formed along with the via openings 107 in the lower portion of the insulating layer 105. However, other photolithography and etch schemes may be employed. The protrusion 109 may be formed during the trench etch process owing to, for example, incomplete resist development caused by nitrogen compounds diffusing within the low-k material of the insulating layer 105, also referred to as resist poisoning, and the like. The presence of structure imperfections such as the protrusion 109 may significantly depend on the materials used, the dimensions of openings 107, 108, process variations, and the like, and may place a burden on the subsequent deposition process for forming a conductive barrier layer on all exposed dielectric surfaces without requiring an undue excess thickness to provide for the minimum required thickness at the critical areas, such as the lower portions 111 and the protrusion 109.

FIG. 1b schematically depicts the semiconductor structure 100 exposed to a deposition atmosphere 120. The deposition atmosphere 120 is meant to include all parameters that affect a sputter deposition of a conductive material on the semiconductor structure 100. Thus, the deposition atmosphere 120 represents a gaseous ambient comprising target atoms and ions 121 and carrier gas atoms and ions 122, which are provided at a specified pressure, indicated by P1, that in one embodiment may range from approximately 1 mT to 5 mTorr. Moreover, a bias voltage, indicated by V1, may be established in the deposition atmosphere 120 by supplying a corresponding bias power to the deposition atmosphere 120. In one embodiment, the bias power supplied to the deposition atmosphere 120 may range from approximately 0–300 Watts, whereas, in other embodiments, the bias power is selected in the range from approximately 0–50 Watts. The parameters defining the deposition atmosphere 120 in FIG. 1b, especially the values of the pressure P1 and of the bias voltage VI, represent a first state of the deposition atmosphere 120. In one embodiment, the deposition atmosphere 120 may comprise tantalum in atomic and ionic form as the target material, i.e., as the material to be deposited, and argon in atomic and ionic form as an inert material required to liberate the target atoms from an appropriate sputter target (not shown). Due to the kinetics within the deposition atmosphere 120, atoms and ions of the inert material may also be deposited to a certain amount on the semiconductor structure 100.

In other embodiments, the deposition atmosphere 120 may additionally include nitrogen atoms and ions (not shown), at least temporarily, to deposit a metal nitride compound continuously or intermittently or temporarily, by correspondingly feeding the nitrogen to the deposition atmosphere 120. In other embodiments, the deposition atmosphere 120 may comprise titanium ions and atoms, and in still a further variant, additionally nitrogen may be present continuously, intermittently or temporarily.

The ratio of ionized particles to atomic particles in the deposition atmosphere 120 may be determined by an ionizing power or a plasma generating power supplied to the deposition atmosphere 120 and may range from approximately 1–40%. In one embodiment, a plasma generating power of approximately 15–25 kilowatts may be appropriate to provide a desired atom and ion density within the deposition atmosphere 120 for commonly used sputter deposition tools. The deposition atmosphere 120 may be established and confined by any appropriate sputter deposition tool capable of performing an ionized sputter deposition process. For instance, an SIP tool, available from Applied Materials Inc., may be used as means for creating and confining the deposition atmosphere 120.

FIG. 1b further shows a first barrier layer 112 substantially comprised of the materials present in the deposition atmosphere 120, wherein the amount of the inert component 122, such as the argon, is typically significantly less than the amount of the target and/or additional component due to the sputter specific kinetics in the deposition atmosphere 120. A thickness of the first barrier layer 112 at the upper portion 110, indicated as 113, exceeds the thickness at the lower portion 111, indicated as 114, due to the parameter setting defining the first state of the deposition atmosphere 120.

A typical process flow for forming the first barrier layer 112 and for establishing the deposition atmosphere 120 with its first state may include the following steps. First, the substrate is inserted in an appropriate sputter tool (not shown) including a solid target material, for example, in form of an electrode plate. By feeding an inert carrier gas, such as argon, and supplying electric power, such as DC power, to the portion of the tool in the vicinity of the sputter target, a plasma is established, causing a bombardment of charged particles, which in turn release target atoms from the sputter target. The pressure P1 is adjusted by controlling a flow rate of the inert carrier gas and the discharge of gaseous components from the sputter tool. By supplying a bias power to the deposition atmosphere 120, i.e., a DC voltage is applied between the target and the semiconductor structure 100, a fraction of the target atoms and a typically smaller fraction of the inert gas, due to the higher ionization potential of the inert gas, may be ionized and accelerated towards the structure 100 in a more directional manner than the remaining non-ionized particles. In other sputter tools, the fraction of ionized target and inert gas atoms may be determined by the power supplied to the plasma generating means, and the bias power determining the bias voltage V1 substantially determines the acceleration of the charged particles towards the structure 100, thereby determining the general directionality of the particles. The trajectories of the particles moving towards the structure also depend on the distance of the sputter target from the structure 100 and from the pressure P1, as these quantities determine the number of scatter events that a particle experiences on its way to the structure 100. Thus, for a given distance, the directionality may also be influenced by the pressure in the deposition atmosphere 120. With the above specified ranges for the pressure P1 and the bias voltage V1 with a distance of approximately 20–40 cm as commonly provided in available ionizing sputter tools, the target atoms and ions 121 moving towards the structure 100 are predominantly deposited on horizontal portions and on the upper portions 110, wherein the composition of the first barrier layer 112 depends on the target material and the additional precursors fed to the deposition atmosphere 120.

FIG. 1c schematically illustrates the structure 100 when exposed to the deposition atmosphere 120 being in a second state defined by a second pressure P2 and a second bias voltage V2, wherein the second pressure and, in one particular embodiment, the second bias voltage are higher than the first pressure P1 and the first bias voltage V1, respectively. The motion of the target ions 121 and of the ionized inert gas 122 is generally more directional due to the increased bias voltage V2, that is, a greater amount of the ionized particles move under the control of the increased bias voltage V2 compared to the first state of the deposition atmosphere 120 shown in FIG. 1a. In order to obtain a wider distribution of the ions generally moving towards the lower portion 111, the pressure P2 may be increased compared to the pressure P1 to increase the number of scatter events especially occurring within the "fine" structure formed by the via openings 107, thereby achieving a deposition of target material preferably at the lower portions 111. Thus, the second state of the deposition atmosphere 120 is selected so as to increase the number of scatter events on a small scale, while the increased bias voltage V2 provides for an increased major movement towards the structure 100. Without restricting the present invention thereto, it is believed that the mean free path-length of the particles during these small scale scatter events is on the order of the structural dimensions of via openings 107, thereby resulting in an enhanced deposition rate at the lower portion 111. In one embodiment, the second state is defined by the bias voltage V2 created by a bias power in the range of approximately 400–600 Watts. In another embodiment, the bias power supplied to create the second bias voltage V2 is approximately 500 Watts and more. It should be noted that the bias power specified above relates to the geometric and structural specifics of presently available ionizing sputter tools. In future device generations, however, different tool configurations may require an adaptation of the parameter values specifying the second state of the deposition atmosphere 120. An according procedure will be described later on.

In one particular embodiment, the pressure P2 of the deposition atmosphere 120 is in the range of approximately 8–15 mTorr, whereas, in other embodiments, the pressure P2 is approximately 10 mTorr or higher.

FIG. 1c further depicts the structure 100 with a second barrier layer 115 formed above the first barrier layer 112. A thickness of the second barrier layer 115 at the upper portion 110, indicated as 116, is less than a thickness at the lower portion 111, denoted as 117. The second barrier layer 115 may be comprised of tantalum and/or tantalum nitride, titanium and/or titanium nitride, and other appropriate materials.

A typical process flow for establishing the second state of the deposition atmosphere 120 and for forming the second barrier layer 115 may involve the following steps. The second pressure P2 and the second bias voltage V2, as well as the material composition within the deposition atmosphere 120, may be obtained in a similar fashion as already described with reference to the first state, however, using parameter values as specified above for P2 and V2. In one embodiment, starting from the first state, the remaining parameters may substantially be maintained constant while adjusting the pressure and the bias voltage to the values P2 and V2. For instance, the plasma generating power may be substantially maintained constant to provide for a similar material composition of the deposition atmosphere 120 in the first and second states, or the fraction of ionized particles compared to non-ionized particles may be kept substantially constant. In a further embodiment, an additional precursor gas, such as nitrogen, may be added to deposition atmosphere 120 continuously, intermittently or temporarily to obtain a desired composition of the barrier layer 115. The material composition of the first barrier layer 112 and the second barrier layer 115 may be substantially the same, or in another embodiment differ from each other. For instance, the first barrier layer 112 may be comprised of tantalum nitride to achieve superior adhesion characteristics on the upper portion 110, while the second barrier layer 115 having the increased thickness 117 at the lower portion 112 may substantially be comprised of tantalum to reduce the electric contact resistance to the underlying metal regions 103. However, in other variations, the composition of the first and second barrier layers 112 and 115 may be selected according to device requirements.

Although in most applications it may be advantageous to transit from the first state into the second state without changing the general conditions of the deposition atmosphere 120, that is, for example, without interrupting the negative pressure condition, in some embodiments it may be considered appropriate to perform a transition step between the first and the second state in order to remove certain process residues, or even to establish a different environment, possibly by employing a different tool, for depositing or otherwise treating the structure 100 having formed thereon the first barrier layer 112. Subsequently, the second barrier layer 115 may be formed by establishing the deposition atmosphere 120 with the second state.

After the deposition of the second barrier layer 115 is completed, the structure 100 comprises a combined barrier layer stack 112, 115 that exhibits a combined thickness that is more uniform compared to conventional barrier deposition techniques and is sufficient to provide for the required barrier and adhesion characteristics, yet being thin enough to not unduly "waste" space for the highly conductive metal to be filled in the trench and via openings 108, 107. Measurements revealed that also at structural imperfections, such as the protrusion 109, a reliable coverage is achieved.

In a further embodiment, one or more test structures having a configuration similar to that of an actual product structure of interest may be prepared and processed in accordance with the steps described with reference to FIG. 1c, illustrating the second state of the deposition atmosphere 120. Since the parameter setting defining the small scale scattering within the deposition atmosphere 120 may depend on tool specifics, the pressure and/or the bias power, i.e., the bias voltage, may be varied to find optimal values for the respective parameters. To this end, the thickness of the barrier layer, such as the second barrier layer 115, may be determined, for example, by scanning electron microscopy, or conductivity measurements, to obtain suitable values for pressure and bias power for a given deposition tool. For a desired difference of the thickness at an upper portion, such as the portion 110, and at a lower portion, such as the portion 111, which indicates a desired difference of the deposition rate at those portions, the corresponding parameter setting may then be determined from the measurement data.

In other embodiments, the test structure may include a plurality of openings having different dimensions to obtain a relationship between the tool parameters, the layer thickness and the structural specifics of the test structure. From the relationship, appropriate parameter values may be determined for a plurality of different deposition tools and a plurality of structures.

As a result, the present invention provides a technique for forming a thin conductive layer within high aspect ratio openings at minimal tool cost in a reliable and reproducible manner in that in a first step a deposition is carried out with reduced directionality of target particles to provide for enhanced deposition on upper portions of the openings. In a subsequent deposition step, the deposition atmosphere is adjusted such that a balance is achieved between increased overall directionality and a reduced mean free pathlength so as to preferably deposit material at lower portions of the openings. Accordingly, a deposition behavior similar to conventional deposition/re-sputter techniques may be achieved, thereby avoiding cost-intensive hardware modifications in the sputter tool and more importantly significantly reducing sensitivity to structural imperfections. Thus, reliability as well as cost efficiency is improved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a barrier layer, comprising:
    depositing a first layer of conductive material comprising said barrier layer onto a substrate having formed therein an opening in a sputter deposition atmosphere having a first state with a pressure of a first valve and a bias power of a first value for accelerating target ions towards said substrate, wherein a bias voltage and a pressure of said deposition atmosphere in said first state is selected so as to obtain a thickness of said first layer is greater at an upper portion of said opening as compared to a bottom portion of said opening;
    establishing a second state for said sputter deposition atmosphere by increasing at least one of said bias power and said pressure to a second value, wherein a bias voltage and a pressure of said deposition atmosphere in said second state is selected so as to obtain a thickness of said second layer that is greater at a bottom portion of said opening as compared to a top portion of said opening, wherein a material composition of said deposition atmosphere in said first state differs from that in said second state; and
    depositing a second layer of conductive material comprising said barrier layer in said sputter deposition atmosphere, said sputter deposition atmosphere being in said second state.

2. The method of claim 1, wherein a pressure in said first state is in the range of approximately 1–5 milliTorr.

3. The method of claim 1, wherein a bias power for accelerating target ions towards said substrate in said first state is in the range of approximately 0–300 Watts.

4. The method of claim 1, wherein said pressure in said second state is higher than approximately 8 milliTorr.

5. The method of claim 1, wherein said bias power in said second state is approximately equal to or higher than 400 Watts.

6. The method of claim 1, wherein said first layer comprises at least one of tantalum, tantalum nitride, titanium and titanium nitride.

7. The method of claim 1, wherein said second layer comprises at least one of tantalum, tantalum nitride, titanium and titanium nitride.

8. The method of claim 1, further comprising supplying a precursor gas to said deposition atmosphere at least during a part of at least one of said first and said second states.

9. A method of controlling a deposition rate in an ionized sputter deposition process, the method comprising a sequence including:
providing a substrate having formed therein at least one via opening with an upper portion and a lower portion;
establishing a deposition atmosphere around said substrate with a specified pressure and a specified bias power for directing target ions towards said substrate;
determining a thickness of a deposited layer at said upper portion and said lower portion of said via opening;
increasing at least one of said bias power and said pressure when an absolute amount of a difference of the thickness at said lower portion and said upper portion is less than a predefined threshold; and
repeating said sequence until said absolute amount is within a target range and using a bias power and a pressure yielding said absolute amount within said target range for forming a barrier layer in vias and trenches of a product substrate.

10. The method of claim 9, wherein at least one of tantalum, tantalum nitride, titanium and titanium nitride is deposited.

11. A method of forming a barrier layer, comprising:
forming, by sputter deposition, a conductive material comprising said barrier layer over an interconnect opening formed on a substrate, wherein a bias power for enhancing a directionality of deposition particles and a pressure are selected to provide a greater thickness of said conductive material comprising said barrier layer at an upper portion of said interconnect opening compared to a lower portion thereof;
increasing said bias power and said pressure; and
continuing the formation of said conductive material comprising said barrier layer to predominantly deposit said conductive material comprising said barrier layer at the lower portion.

12. The method of claim 11, wherein said increased pressure is higher than approximately 8 milliTorr.

13. The method of claim 11, wherein said increased bias power is approximately equal to or higher than 400 Watts.

14. The method of claim 11, wherein said conductive material comprising said barrier layer comprises at least one of tantalum, tantalum nitride, titanium and titanium nitride.

15. The method of claim 11, wherein a material composition after increasing said bias power and said pressure in said deposition atmosphere differs from a material composition prior to increasing said bias power and said pressure.

16. The method of claim 11, wherein a material composition of said deposition atmosphere remains substantially constant.

17. The method of claim 11, further comprising supplying, at least temporarily, a precursor gas to the deposition atmosphere.

* * * * *

UNITED STATES PATENT AND TRADEMARK OFFICE
CERTIFICATE OF CORRECTION

PATENT NO. : 6,984,294 B2 Page 1 of 1
DATED : January 10, 2006
INVENTOR(S) : Michael Friedemann and Volker Kahlert It is certified that error appears in the above-identified patent and that said Letters Patent is hereby corrected as shown below:

<u>Column 10,</u>
Line 30, change "valve" to -- value --.
Line 34, after "first layer" insert -- that --.

Signed and Sealed this

Twenty-first Day of March, 2006

JON W. DUDAS
*Director of the United States Patent and Trademark Office*